United States Patent
Wu et al.

(10) Patent No.: US 6,187,613 B1
(45) Date of Patent: Feb. 13, 2001

(54) PROCESS FOR UNDERFILL ENCAPSULATING FLIP CHIP DRIVEN BY PRESSURE

(75) Inventors: Chin-Yung Wu, Miaoli Hsien; Tay-Yuan Chen, Changhua Hsien, both of (TW)

(73) Assignee: Industrial Technology Research Institute (TW)

( * ) Notice: Under 35 U.S.C. 154(b), the term of this patent shall be extended for 0 days.

(21) Appl. No.: 09/434,854

(22) Filed: Nov. 4, 1999

(51) Int. Cl.$^7$ .......................... H01L 21/44; H01L 21/48; H01L 21/50
(52) U.S. Cl. .......................... 438/108; 438/124; 438/126; 438/127
(58) Field of Search .................................. 438/108, 124, 438/126, 127

(56) References Cited

U.S. PATENT DOCUMENTS

| | | | |
|---|---|---|---|
| 4,784,872 | * 11/1988 | Moeller et al. | 427/96 |
| 5,270,574 | * 12/1993 | Boysel | 257/787 |
| 5,354,714 | * 10/1994 | Boysel | 437/209 |
| 5,817,545 | 10/1998 | Wang et al. | |
| 5,904,505 | * 5/1999 | Hotta et al. | 438/124 |

* cited by examiner

*Primary Examiner*—John F. Niebling
*Assistant Examiner*—David A Zarneke
(74) *Attorney, Agent, or Firm*—Knobbe, Martens, Olson & Bear LLP

(57) ABSTRACT

The present invention provides a process for underfill encapsulating a flip chip which is driven by pressure. First, a metal foil is placed on a flip chip that has been connected to a substrate. Then, a downward pressure is applied to the metal foil so as to form a space among the metal foil, the flip chip, and the substrate. Then, an encapsulant is filled into the space under pressure. The chip on which the metal foil has been placed and that has been encapsulated is moved away. Then, another metal foil is placed on another flip chip that has been connected to the substrate to undergo the above-mentioned encapsulation process. Encapsulation of the next chip can begin without waiting the encapsulant packaging the prior chip to cure. Thus, the efficiency of the encapsulating machine can be greatly enhanced, and the conventional problems of encapsulant adhering to the mold can also be solved. After the encapsulant is cured, if the metal foil is left on the chip, the final chip package can achieve some special effects including heat dissipation, electromagnetic interference (EMI), and electric static discharge (ESD).

6 Claims, 1 Drawing Sheet

PROCESS FOR UNDERFILL ENCAPSULATING FLIP CHIP DRIVEN BY PRESSURE

BACKGROUND OF THE INVENTION

1. Field of the Invention

The present invention relates to a process for underfill encapsulating a flip chip driven by pressure, and more particularly to an encapsulation process in which encapsulation of the next chip can begin without waiting the encapsulant packaging the prior chip to cure.

2. Description of the Prior Art

Due to the demand on high-density and high-power electronic packaging, flip chip technology has become important in many fields. The so-called flip chip technology is characterized by flipping over the bare die for attaching to a substrate. When an organic material is used as the substrate, the great difference in the coefficient of thermal expansion between the organic substrate (14–17 ppm/° C. and the silicon wafer (4 ppm/° C.) causes significant strain on the solder connections during temperature cycling, which results in easy deterioration of the connections.

Therefore, to enhance reliability, encapsulant is usually filled into the space between the substrate and the chip. In this way, the stress can be dispersed to the encapsulant so as to decrease the stress taken by the connections. Thus, the connection cracking can be alleviated, the crack will not extend, and the fatigue life of the connections can be prolonged. In addition, the encapsulant can also prevent the transmission of leak current caused by impurities between the solder connections. Statistic data show that the reliability of the chip can be increased five to ten times once underfill encapsulation is conducted. Therefore, underfill encapsulation is a necessary process. However, it suffers from the long time required for underfilling and curing the encapsulant.

Currently, most flip chip packages are encapsulated by dispensing a liquid encapsulant with low viscosity along the periphery of the chip. Capillary action, which is generated from the encapsulant in the fine space (less than 100 $\mu$m) between the chip and the substrate, drives the encapsulant to fill the gap between the solder connections. The disadvantages of such a process include: (1) Since the filling is conducted by capillary action, it is very slow. This problem becomes even more serious as the chip size increases because the filling time is proportional to the square of the length of the chip. For example, in a typical encapsulation operation, the filling takes several minutes to several tens of minutes for a 7 mm$^2$ chip depending on the filling temperature. (2) Since the capillary action is insufficient and the pressure can not be effectively maintained, voids are easily formed in the encapsulant when the filling is complete. Moreover, the adhesion on the interface is also insufficient. Thus, the reliability is adversely affected. (3) For the sake of the environment, liquid encapsulation should be reworkable, which can prevent the problems of known good die (KGD). However, since thermoplastic material is introduced into the epoxy resin (encapsulant), the viscosity of the encapsulant will be greatly increased, which makes the dispensing process more difficult.

Recently, the Cornell Injection Molding Program has provided an underfill encapsulation process in a patent (U.S. Pat. No. 5,817,545, Wang et al.) assigned to Cornell Research Foundation, Inc., which can solve the disadvantages of the above-mentioned dispensing process. The feature of such a process is that the underfill encapsulation process is conducted in a hermetic environment, that is, in a mold. Since the chip is hermetically sealed by the mold, the driving force for filling the encapsulant into the gap need not to be generated from capillary action, but results from the pressure applied to the dispensing device. Thus, the filling time is short and the pressure can be effectively maintained. Such an underfill encapsulation process driven by pressure has the following advantages: (1) Since the filling process is driven by applied pressure, the filling time can be reduced to several seconds. (2) Since the filling time is short, the liquid encapsulant with faster curing kinetics can be used, thus saving the curing time. (3) Since the filling is driven by pressure, the encapsulant material suitable for use in this process can have a 1000 times higher viscosity than that suitable for use in a dispensing process. The selection of encapsulant will become much more flexible. Therefore, encapsulant materials with higher viscosity, for example, those which can be reworkable, with higher adhesion force, and which are filled with non-ball shaped silica, can be used in this process. (4) The reliability of the products can be increased. Since the pressure is increased in this process, voids can be effectively lessened, adhesion in the interface can be increased, and encapsulation can be conducted at room temperature. Also, the periphery of the chip can be packaged into a fillet shape. All those are helpful to increase the reliability.

Having the above advantages, however, the Wang's underfill encapsulation process driven by pressure still suffers from some problems. When the wafer is encapsulated, since the mold is fixed to the encapsulating machine, in order to prevent the encapsulant to stick to the mold, the mold can not be removed until the encapsulant is cured. After the encapsulant is cured, the mold is removed, then, another wafer is placed in the mold for encapsulation. The curing of the encapsulant takes several tens of seconds to several minutes, which makes the entire process long.

SUMMARY OF THE INVENTION

The object of the present invention is to solve the above-mentioned problems and to provide a process for underfill encapsulating a flip chip driven by pressure. Since the present invention uses a metal foil that is not fixed to the encapsulating machine to replace the mold, when the encapsulation is completed, the chip and the metal foil attached on it can be taken away together. Therefore, there is no need to wait the encapsulant to cure. Encapsulation of the next chip can begin before the encapsulant packaging the prior chip is cured. Thus, the efficiency of the encapsulating machine can be greatly enhanced.

To achieve the above-mentioned object, the process for underfill encapsulating a flip chip which is driven by pressure of the present invention comprises the steps of:

(a) placing a metal foil on a flip chip that has been connected to a substrate;

(b) applying a downward pressure to the metal foil so as to form a space among the metal foil, the flip chip, and the substrate;

(c) filling an encapsulant into the space under pressure;

(d) removing away the chip on which the metal foil has been placed and that has been encapsulated;

(e) placing another metal foil on another flip chip that has been connected to the substrate; and (f) repeating steps (b) to (e) a plurality of times, wherein in the last repetition, step (e) is omitted.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
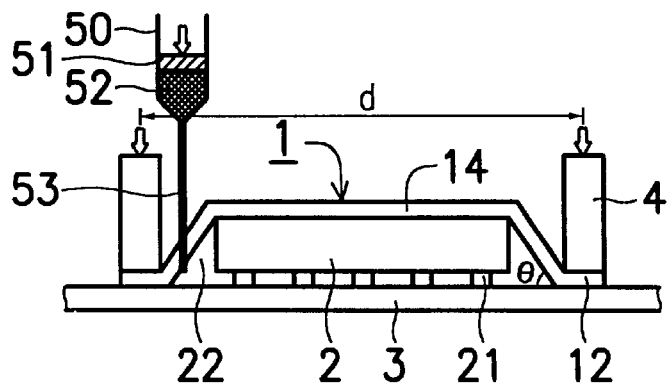
FIG. 1 shows a schematic cross-sectional view of the device for underfill encapsulating flip chips according to a first embodiment of the present invention.

FIG. 1 shows a schematic cross-sectional view of the device for underfill encapsulating flip chips according to a first embodiment of the present invention. Referring to FIG. 1, a flip chip 2 is connected to a substrate 3 by means of solder connections 21, and a metal foil 1 is placed on the flip chip 2. A downward pressure is applied to a pair of pressing plates 4 so as to provide a closing pressure to the metal foil 1, such that a space 22 is formed among the metal foil 1, the flip chip 2, and the substrate 3 and the metal foil 1 is attached to the chip 2. The sealing between the metal foil 1 and the substrate 3 can be enhanced by means of pressing the periphery 12 of the metal foil via the pressing plates 4. This can also prevent flooding and flashing of the encapsulant. However, the closing pressure can not be so large as to damage the substrate 3.

The packaging shape can be controlled by means of adjusting the distance d between the two pressing plates at the periphery 12 of the metal foil. The distance d can be adjusted to adapt to different sizes of chips to be packaged. When chips with the same size are packaged, the angle θ between the metal foil 1 and the substrate 3 can be controlled by changing the distance d; thus, the side space and the flowing pattern of the encapsulant can both be controlled.

Subsequently, an encapsulant 52 received in a hopper 50 is driven to the space 22 via an injection needle 53 by means of the pressure provided by a piston 51. Thus, the encapsulant can be filled under the chip 2.

Figure 2:
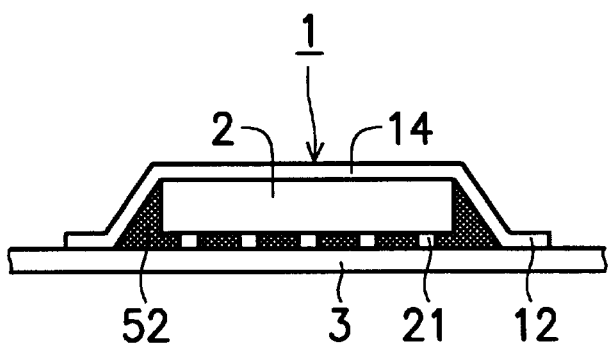
FIG. 2 shows the chip attached with the metal foil, which has been taken away from the encapsulating machine, when the encapsulating of the present invention is completed.

The metal foil 1 used in the present invention is not a mold fixed to the encapsulation machine, but is separated from the encapsulation machine. Therefore, when the encapsulation is completed, the chip 2 and the metal foil 1 attached on it can be taken away together. Therefore, there is no need to wait for the encapsulant to cure. Encapsulation of the next chip, which has been attached to the substrate 3, can begin before the encapsulant packaging the prior chip is cured. FIG. 2 shows the chip 2 attached with the metal foil 1, which has been taken away from the encapsulating machine when the encapsulating of the present invention is completed. The black portion indicates the encapsulant.

Figure 3:
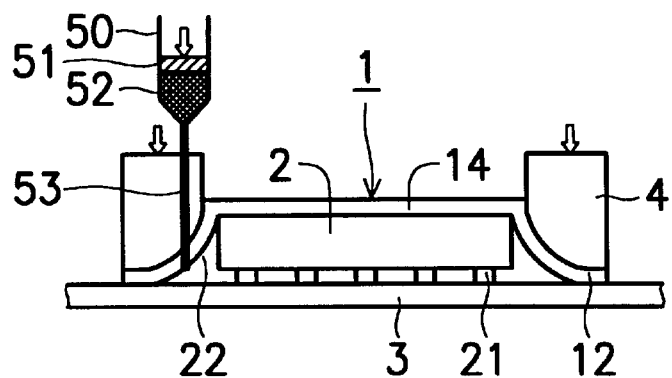
FIG. 3 shows a schematic cross-sectional view of the device for underfill encapsulating flip chips according to a second embodiment of the present invention.

FIG. 3 shows a schematic cross-sectional view of the device for underfill encapsulating flip chips according to a second embodiment of the present invention, which is very similar to FIG. 1. However, in FIG. 3, the bottom of the pressing plate 4 is designed as a fillet shape, which can effectively decrease concentration of the stress.

The material and the thickness of the metal foil suitable for used in the present invention depend on practical needs. Preferably, the metal foil can withstand an encapsulating pressure higher than 100 psi, and has a thickness of 0.01 to 0.1 mm. In addition, metal foil can be replaced by an organic material film.

The chip which has been encapsulated and taken away can be heated until the encapsulant is cured to a desired extent. Subsequently, the metal foil can be removed or retained according to practical needs. If the metal foil is left on the chip, the final chip package can achieve some special effects including heat dissipation, electromagnetic interference (EMI), and electric static discharge (ESD).

According to the present invention, encapsulation of the next chip can begin without waiting the encapsulant packaging the prior chip to cure. Thus, the filling time can be greatly saved and the efficiency of the encapsulating machine can be greatly enhanced.

In conclusion, the process for underfill encapsulating flip chips driven by pressure according to the present invention not only has the advantages of Wang's encapsulation process under pressure, but also has the following additional advantages:

(1) When the encapsulation is completed, the chip and the metal foil attached on it can be taken away together. Therefore, there is no need to wait for the encapsulant to cure. Encapsulation of the next chip can begin before the encapsulant packaging the prior chip is cured. Thus, the efficiency of the encapsulating machine can be greatly enhanced, and the conventional problems of encapsulant adhering to the mold can also be solved.

(2) Conventional encapsulating mold is replaced by a metal foil that has simple structure and can be adjusted easily. Thus, the package pattern can be more flexible.

(3) After the encapsulant is cured, if the metal foil is left on the chip, the final chip package can achieve some special effects including heat dissipation, electromagnetic interference (EMI), and electric static discharge (ESD).

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A process for underfill encapsulating a flip chip which is driven by pressure, comprising the steps of:
   (a) placing a metal foil on a flip chip that has been connected to a substrate;
   (b) applying a downward pressure to the metal foil so as to form a space among the metal foil, the flip chip, and the substrate;
   (c) filling an encapsulant into the space under pressure;
   (d) removing away the chip on which the metal foil has been placed and that has been encapsulated;
   (e) placing another metal foil on another flip chip that has been connected to the substrate; and
   (f) repeating steps (b) to (e) a plurality of times, wherein in the last repetition, step (e) is omitted.

2. The process as claimed in claim 1, wherein the metal foil has a thickness of 0.01 to 0.1 mm.

3. The process as claimed in claim 1, further comprising, after step (d), a step (d1) of curing the encapsulant.

4. The process as claimed in claim 3, further comprising, after step (d1), a step of removing the metal foil from the flip chip.

5. The process as claimed in claim 3, further comprising, after step (d1), a step of leaving the metal foil on the flip chip.

6. The process as claimed in claim 3, wherein the metal foil is replaced by an organic material film.

* * * * *